(12) United States Patent
Lin et al.

(10) Patent No.: US 12,490,402 B2
(45) Date of Patent: Dec. 2, 2025

(54) FLEXIBLE RACK CABINET DESIGN

(71) Applicant: DELL PRODUCTS L.P., Round Rock, TX (US)

(72) Inventors: Chun-Cheng Lin, New Taipei (TW); Yueh-Chun Tsai, Taipei (TW); Yu-Lin Chen, Taipei (TW)

(73) Assignee: Dell Products L.P., Round Rock, TX (US)

( * ) Notice: Subject to any disclaimer, the term of this patent is extended or adjusted under 35 U.S.C. 154(b) by 295 days.

(21) Appl. No.: 18/301,620

(22) Filed: Apr. 17, 2023

(65) Prior Publication Data

US 2024/0349445 A1 Oct. 17, 2024

(51) Int. Cl.
*H05K 7/14* (2006.01)
*H05K 7/18* (2006.01)
*H05K 7/20* (2006.01)

(52) U.S. Cl.
CPC ........... *H05K 7/183* (2013.01); *H05K 7/1489* (2013.01); *H05K 7/20709* (2013.01)

(58) Field of Classification Search
CPC .. H05K 7/183; H05K 7/1489; H05K 7/20709; H05K 7/1488
See application file for complete search history.

(56) References Cited

U.S. PATENT DOCUMENTS

| | | | | |
|---|---|---|---|---|
| 6,122,173 A | * | 9/2000 | Felcman | G06F 1/16 |
| | | | | 312/223.1 |
| 6,985,357 B2 | * | 1/2006 | Cauthron | G06F 1/181 |
| | | | | 312/223.1 |
| 8,755,189 B2 | | 6/2014 | Crisp et al. | |
| 10,330,299 B1 | * | 6/2019 | Ivey | H05K 7/183 |
| 2015/0189787 A1 | | 7/2015 | Bailey et al. | |

* cited by examiner

*Primary Examiner* — Imani N Hayman
*Assistant Examiner* — Hung Q Dang
(74) *Attorney, Agent, or Firm* — Larson Newman, LLP

(57) ABSTRACT

A flexible orientation rack cabinet includes a top panel, a bottom panel, first and second edge panels, a first and second flexible mounting flanges. The top panel includes a first U-space adjustment portion. The bottom panel includes a second U-space adjustment portion. The first flexible mounting flange is in physical communication with the first edge panel and includes a third U-space adjustment portion. The second flexible mounting flange is in physical communication with the second edge panel and includes a fourth U-space adjustment portion. The flexible orientation rack cabinet is in a first orientation when multiple first server rails are attached to the first and second U-space adjustment portions.

19 Claims, 7 Drawing Sheets

FLEXIBLE RACK CABINET DESIGN

FIELD OF THE DISCLOSURE

The present disclosure generally relates to information handling systems, and more particularly relates to a flexible cabinet design.

BACKGROUND

As the value and use of information continues to increase, individuals and businesses seek additional ways to process and store information. One option is an information handling system. An information handling system generally processes, compiles, stores, or communicates information or data for business, personal, or other purposes. Technology and information handling needs, and requirements can vary between different applications. Thus, information handling systems can also vary regarding what information is handled, how the information is handled, how much information is processed, stored, or communicated, and how quickly and efficiently the information can be processed, stored, or communicated. The variations in information handling systems allow information handling systems to be general or configured for a specific user or specific use such as financial transaction processing, airline reservations, enterprise data storage, or global communications. In addition, information handling systems can include a variety of hardware and software resources that can be configured to process, store, and communicate information and can include one or more computer systems, graphics interface systems, data storage systems, networking systems, and mobile communication systems. Information handling systems can also implement various virtualized architectures. Data and voice communications among information handling systems may be via networks that are wired, wireless, or some combination.

SUMMARY

A flexible orientation rack cabinet includes a top panel, a bottom panel, first and second edge panels, a first and second flexible mounting flanges. The top panel may include a first U-space adjustment portion. The bottom panel may include a second U-space adjustment portion. The first flexible mounting flange may be in physical communication with the first edge panel and may include a third U-space adjustment portion. The second flexible mounting flange may be in physical communication with the second edge panel and may include a fourth U-space adjustment portion. The flexible orientation rack cabinet may be in a first orientation when multiple first server rails are attached to the first and second U-space adjustment portions.

BRIEF DESCRIPTION OF THE DRAWINGS

It will be appreciated that for simplicity and clarity of illustration, elements illustrated in the Figures are not necessarily drawn to scale. For example, the dimensions of some elements may be exaggerated relative to other elements. Embodiments incorporating teachings of the present disclosure are shown and described with respect to the drawings herein, in which.

The use of the same reference symbols in different drawings indicates similar or identical items.

DETAILED DESCRIPTION OF THE DRAWINGS

The following description in combination with the Figures is provided to assist in understanding the teachings disclosed herein. The description is focused on specific implementations and embodiments of the teachings and is provided to assist in describing the teachings. This focus should not be interpreted as a limitation on the scope or applicability of the teachings.

Figure 1:
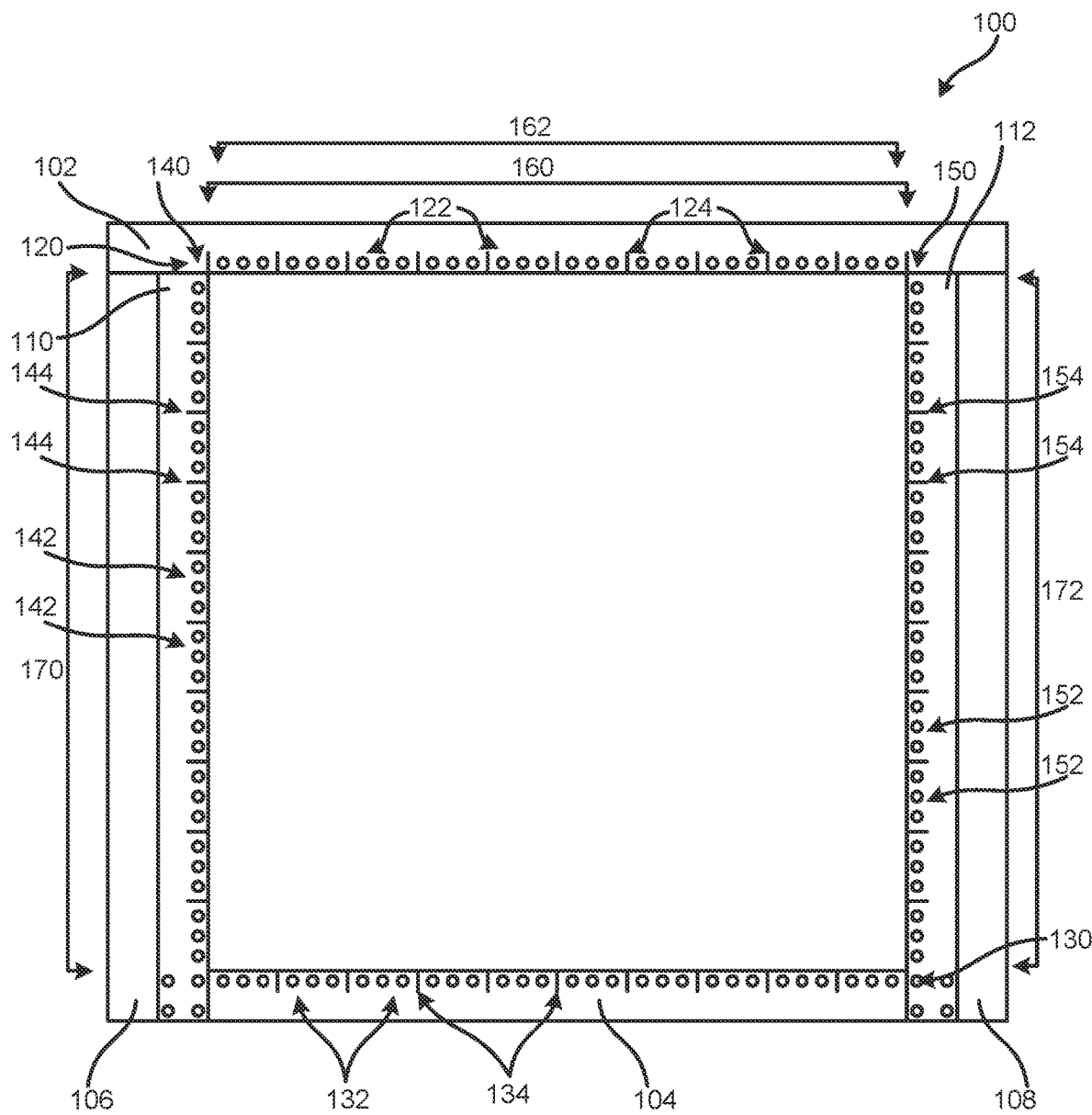
FIG. 1 is a diagram of a flexible orientation rack cabinet according to at least one embodiment of the present disclosure.

FIG. 1 illustrates a flexible orientation rack cabinet 100 according to at least one embodiment of the present disclosure. Flexible orientation rack cabinet 100 may hold one or more servers or information handling systems. For purposes of this disclosure, an information handling system can include any instrumentality or aggregate of instrumentalities operable to compute, calculate, determine, classify, process, transmit, receive, retrieve, originate, switch, store, display, communicate, manifest, detect, record, reproduce, handle, or utilize any form of information, intelligence, or data for business, scientific, control, or other purposes. For example, an information handling system may be a personal computer (such as a desktop or laptop), tablet computer, mobile device (such as a personal digital assistant (PDA) or smart phone), blade server or rack server, a network storage device, or any other suitable device and may vary in size, shape, performance, functionality, and price. The information handling system may include random access memory (RAM), one or more processing resources such as a central processing unit (CPU) or hardware or software control logic, ROM, and/or other types of nonvolatile memory. Additional components of the information handling system may include one or more disk drives, one or more network ports for communicating with external devices as well as various input and output (I/O) devices, such as a keyboard, a mouse, touchscreen and/or a video display. The information handling system may also include one or more buses operable to transmit communications between the various hardware components.

Flexible orientation rack cabinet 100 includes a top panel 102, a bottom panel 104, and side panels 106 and 108. Flexible orientation rack cabinet 100 also includes flexible mounting flanges 110 and 112. Top panel 102 includes U-space adjustment portion 120, which in turn includes multiple holes 122 and lines 124. Bottom panel 104 includes U-space adjustment portion 130, which in turn includes multiple holes 132 and lines 134. Flexible mounting flange 110 includes U-space adjustment portion 140, which in turn includes multiple holes 142 and lines 144. Flexible mounting flange 112 includes U-space adjustment portion 150, which in turn includes multiple holes 152 and lines 154. Flexible orientation rack cabinet 100 may include additional components without varying from the scope of this disclosure.

Current rack cabinets may have a fixed dimension design and size. For example, these rack cabinets may have a predefined single orientation for servers within the rack cabinets, such as either all servers being horizontal or all servers being vertical in the rack cabinet. Additionally, current rack cabinets may have a set U-space. In this situation, if an individual wanted to expand the U-space of the rack cabinet, that individual would have to purchase a completely new rack cabinet designed with that amount of U-space. Components in flexible orientation rack cabinet 100 may be utilized to overcome the deficiencies of current rack cabinets.

In certain examples, flexible orientation rack cabinet 100 may have different inner dimensions to enable different server orientations with the flexible orientation rack cabinet. For example, when U-space adjustment portions 120, 130, 140, and 150 are within flexible orientation rack cabinet 100, an opening within the flexible orientation rack cabinet may have an initial horizontal width 160 and an initial vertical height 170. Initial horizontal width 160 may be any suitable width, such as 450 mm, and initial vertical height 170 may be any suitable height, such as 450 mm. In an example, initial horizontal width 160 may be referred to as an inner width dimension of flexible orientation rack cabinet 100, and initial vertical height 170 may be referred to as an inner height dimension of the flexible orientation rack cabinet.

In certain examples, flexible orientation rack cabinet 100 may be placed in different orientations based on different combinations of U-space adjustment portions 120, 130, 140, and 150 utilized to connect server rails the flexible orientation rack cabinet. The different orientations of flexible orientation rack cabinet 100 may result from different locations of server rails in the flexible orientation rack cabinet. In an example, if U-space adjustment portion 140 on flexible mounting flange 110 and U-space adjustment portion 150 is on flexible mounting flange 112 are connected to server rails, flexible orientation rack cabinet 100 may have a horizontal orientation. Horizontal orientation may be any suitable width, such as a width for 10U horizontal servers. In an example, if U-space adjustment portion 120 of top panel 102 and U-space adjustment portion 130 of bottom panel 104 are connected to server rails, flexible orientation rack cabinet 100 may have a vertical orientation. Vertical orientation may be any suitable height, such as a height for 10U vertical server blades. In an example, a horizontal width 162 may be referred to as a server and rail width dimension of flexible orientation rack cabinet 100, and a vertical height 172 may be referred to as a server and rail height dimension of the flexible orientation rack cabinet.

In an example, holes 122 and lines 124 within U-space adjustment portion 120 may enable server rails to be added to the U-space adjustment portion of top panel 102. Similarly, holes 132 and lines 134 within U-space adjustment portion 130 may enable server rails to be added to the U-space adjustment portion of bottom panel 104. Holes 142 and lines 144 within U-space adjustment portion 140 may enable server rails to be added to the U-space adjustment portion of flexible mounting flange 110. Holes 152 and lines 154 within U-space adjustment portion 150 may enable server rails to be added to the U-space adjustment portion of flexible mounting flange 150.

Figure 2:
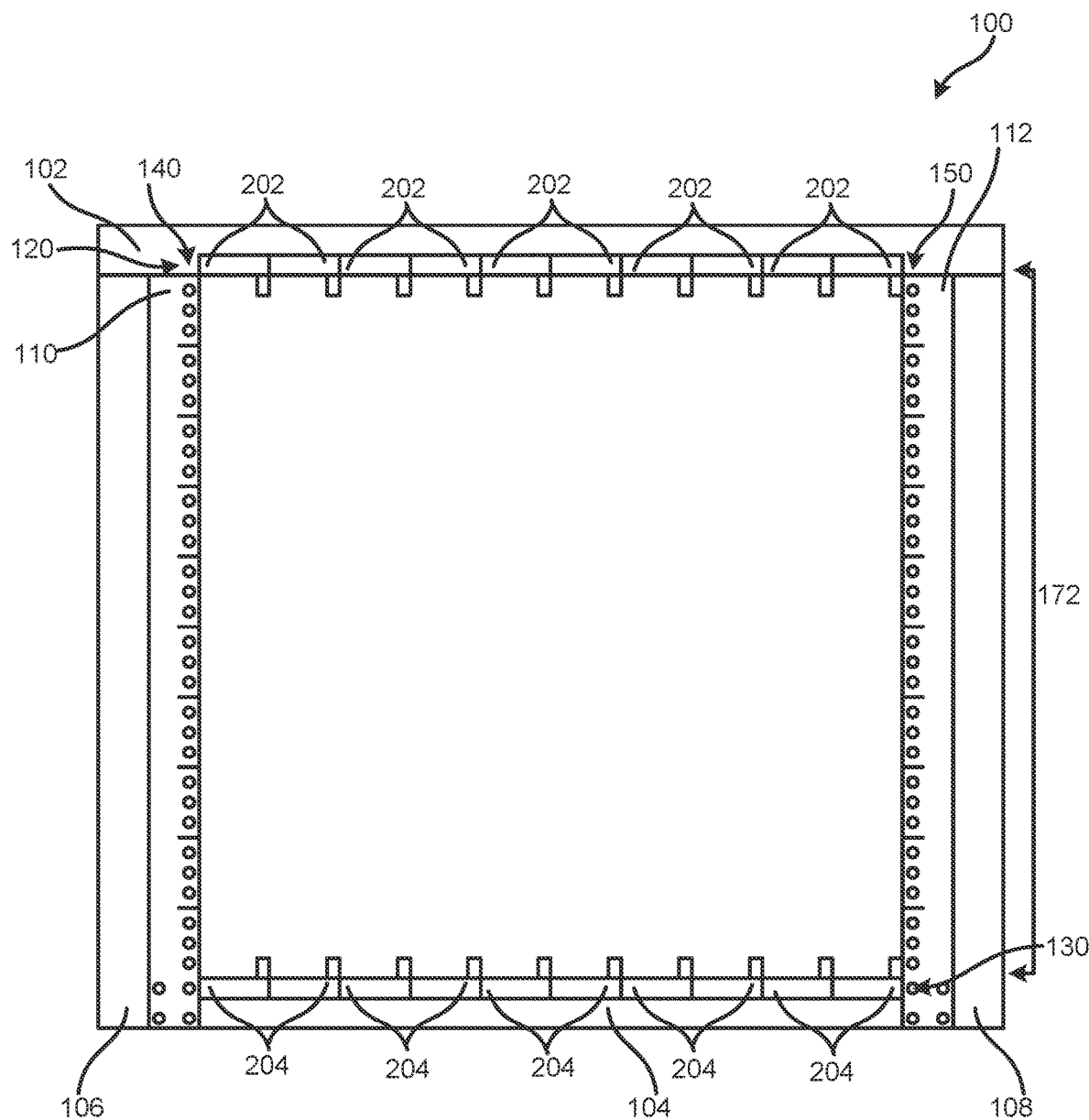
FIG. 2 is a diagram of a flexible orientation rack cabinet configured in a vertical orientation according to at least one embodiment of the present disclosure.
Figure 3:
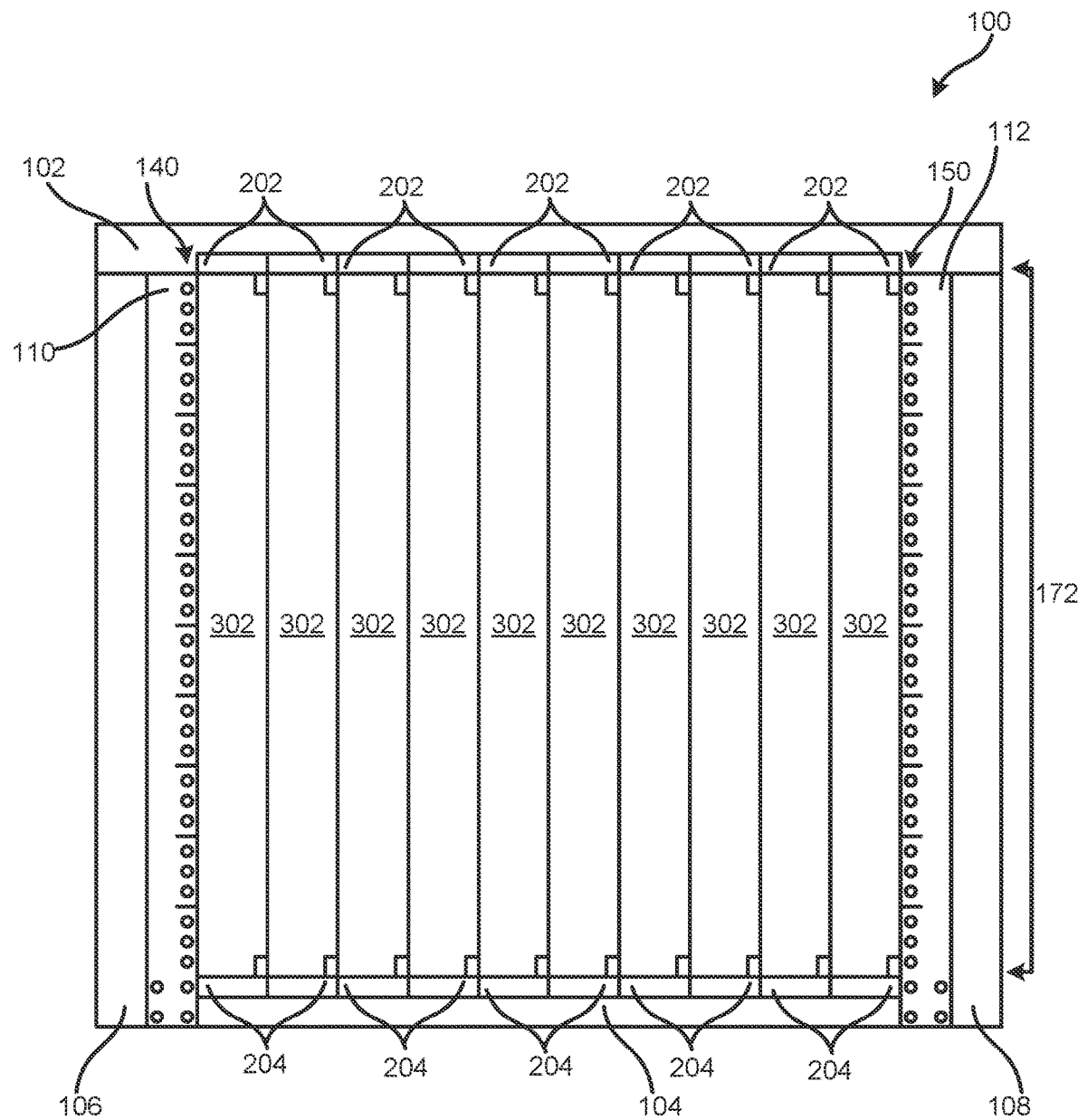
FIG. 3 is a diagram of a flexible orientation rack cabinet configured in a vertical orientation with vertical blades according to at least one embodiment of the present disclosure.

FIGS. 2 and 3 illustrate flexible orientation rack cabinet 100 configured in a vertical orientation according to at least one embodiment of the present disclosure. In an example, multiple top vertical server rails 202 have been added to U-space adjustment portion 120 of FIG. 1 on top panel 102 and multiple bottom vertical server rails 204 have been added to U-space adjustment portion 130 of FIG. 1 on bottom panel 104. In this example, flexible orientation rack cabinet 100 is configured in the vertical orientation with server and rail vertical height 172. When in the vertical orientation, flexible orientation rack cabinet 100 may be configured as a blade server rack to hold blade servers in a vertical orientation. For example, when in the vertical orientation, flexible orientation rack cabinet 100 may receive multiple vertical servers 302 as illustrated in FIG. 3. In an example, each vertical server 302 may be connected to a different pair of top vertical server rail 202 and bottom vertical server rail 204 as illustrated in FIG. 3. In certain examples, vertical servers 302 may be 10U servers, such that each server has a length or height defined by a standard for 10U rack space.

In certain examples, when flexible orientation rack cabinet 100 is in the vertical orientation, U-space adjustment portions 140 and 150 remain within respective flexible mounting flanges 110 and 112. In this situation, flexible mounting flanges 110 and 112 may provide support for vertical servers 302. In an example, the addition of top vertical server rails 202 to U-space adjustment portion 120 of FIG. 1 may result in multiple server attachment locations along top panel 102, and the addition of bottom vertical server rails 204 to U-space adjustment portion 130 of FIG. 1 may result in multiple server attachment locations along bottom panel 104.

Figure 4:
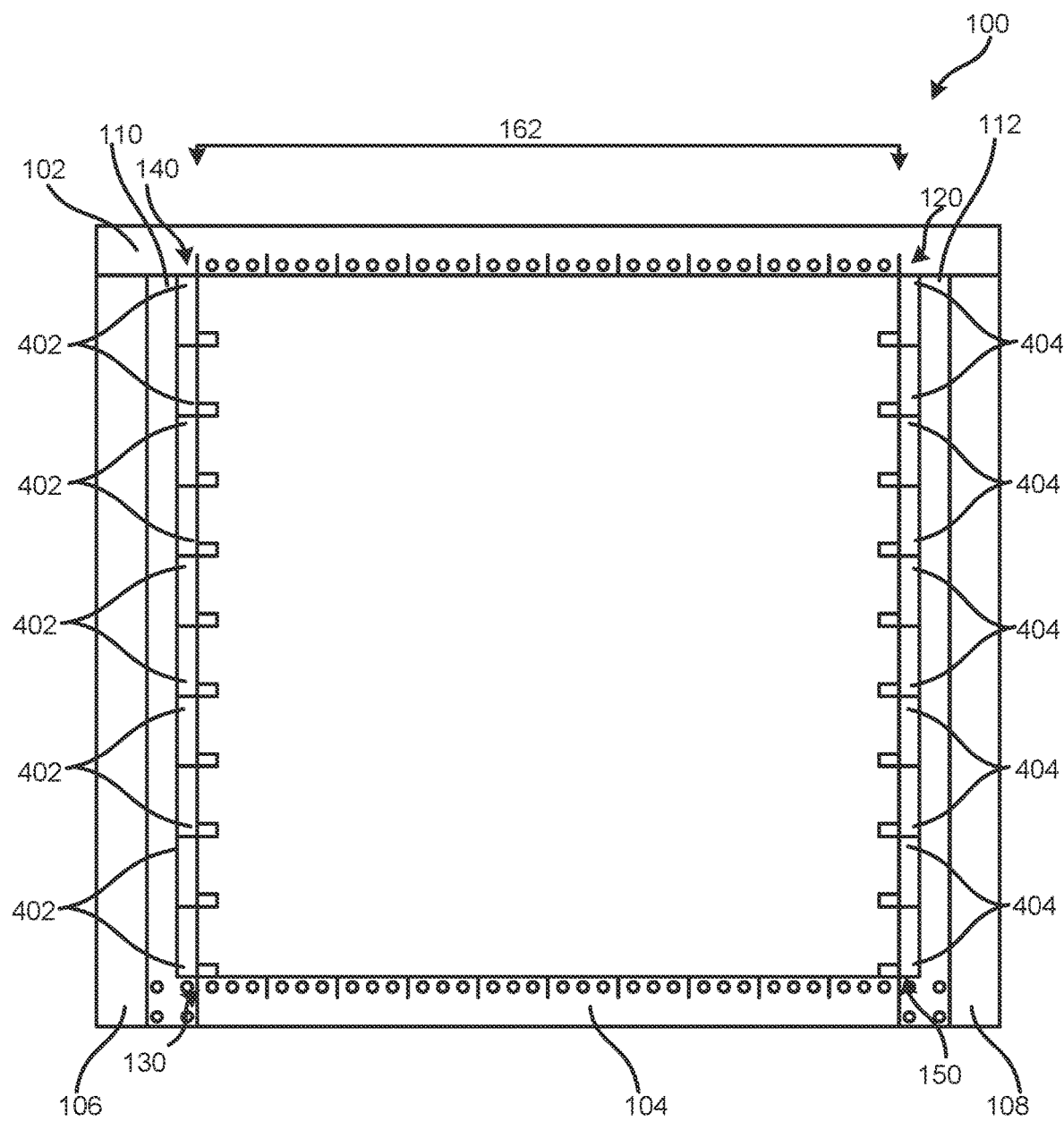
FIG. 4 is a diagram of a flexible orientation rack cabinet configured in a horizontal orientation according to at least one embodiment of the present disclosure.
Figure 5:
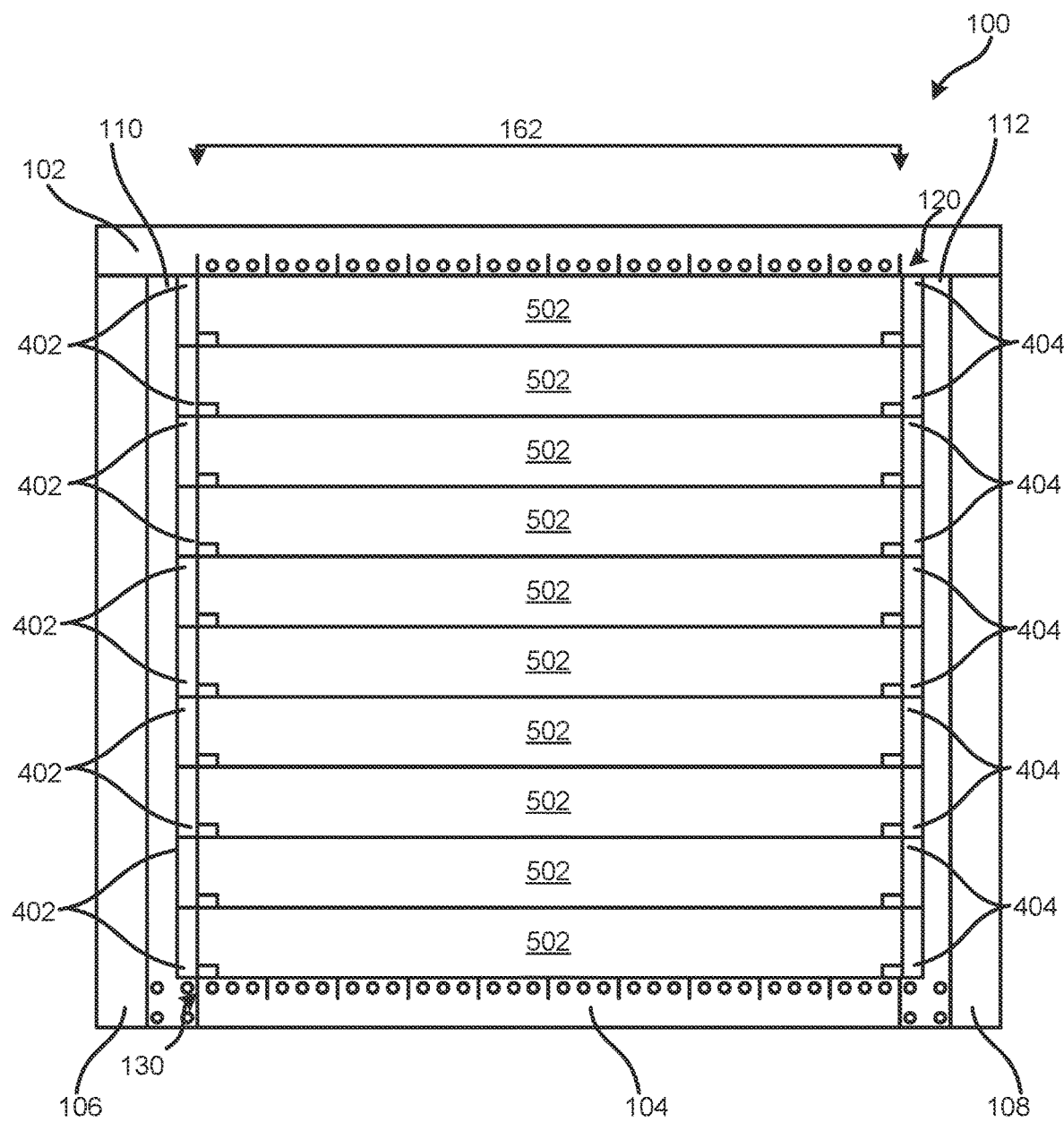
FIG. 5 is a diagram of a flexible orientation rack cabinet configured in a horizontal orientation with horizontal servers according to at least one embodiment of the present disclosure.

FIGS. 4 and 5 illustrate flexible orientation rack cabinet 100 configured in a horizontal orientation according to at least one embodiment of the present disclosure. In an example, multiple left horizontal server rails 402 may be added to U-space adjustment portion 140 of FIG. 1 on flexible mounting flange 110, and multiple right horizontal server rails 404 may be added to U-space adjustment portion 150 of FIG. 1 on flexible mounting flange 112. In this example, flexible orientation rack cabinet 100 is configured in the horizontal orientation with horizontal server and rail width 162. When in the horizontal orientation, flexible orientation rack cabinet 100 may be configured as a sled server rack to hold servers in a horizontal orientation. For example, when in the horizontal orientation, flexible orientation rack cabinet 100 may receive multiple horizontal servers 502 as illustrated in FIG. 5. In an example, horizontal servers 502 may be 10U servers, such that each server has a length or width defined by a standard for 10U rack space.

In certain examples, when flexible orientation rack cabinet 100 is in the horizontal orientation, U-space adjustment portions 120 and 130 remain within respective top portion 102 and bottom portion 104. In this situation, top portion 102 and bottom portion 104 may provide support for horizontal servers 502. In an example, the addition of left horizontal server rails 402 to U-space adjustment portion 140 of FIG. 1 may result in multiple server attachment locations along flexible mounting flange 110, and the addition of right horizontal server rails 404 to U-space adjustment portion 150 of FIG. 1 may result in multiple server attachment locations along flexible mounting flange 112.

Figure 6:
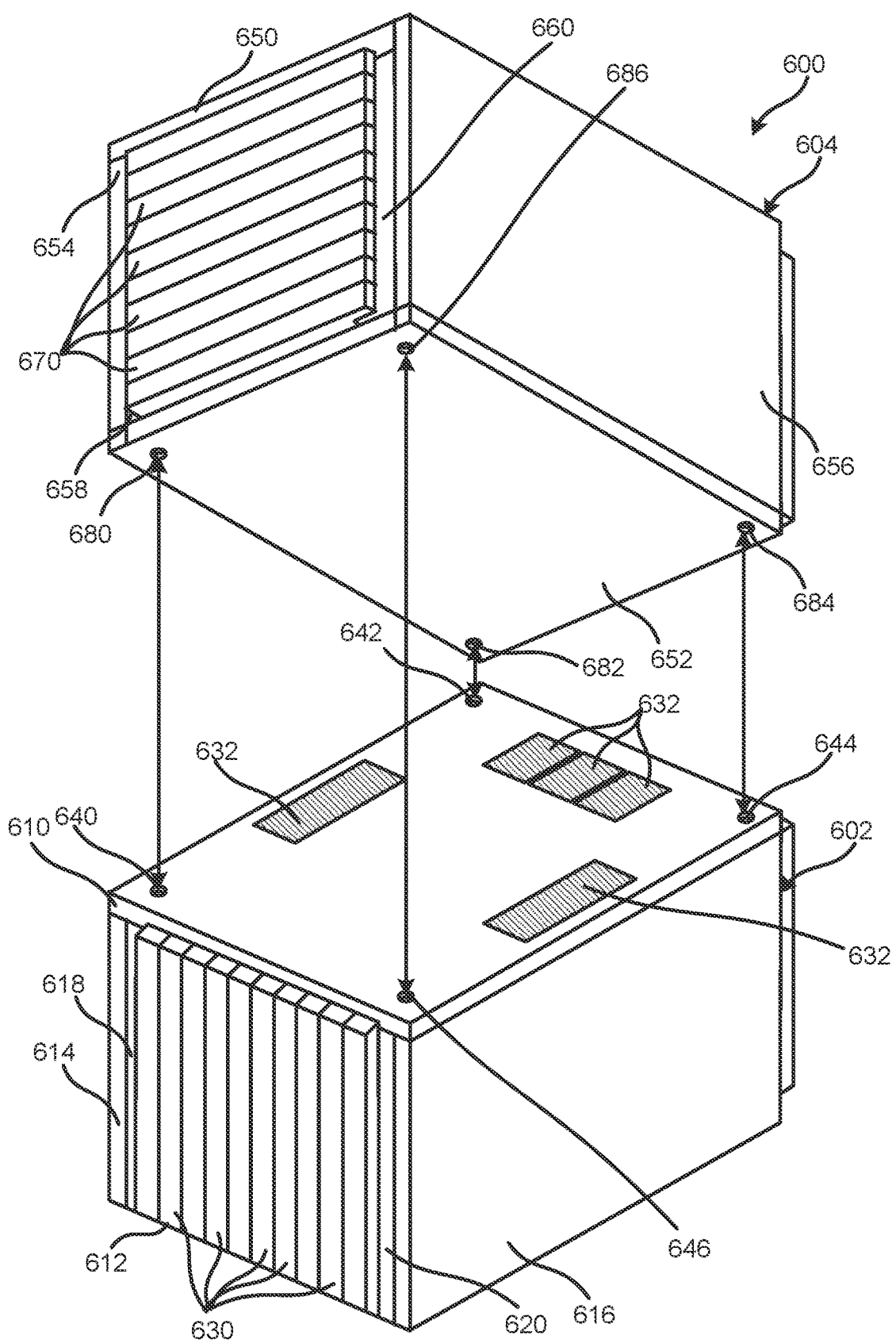
FIG. 6 is a diagram of an alignment between two flexible orientation rack cabinets according to at least one embodiment of the present disclosure.
Figure 7:
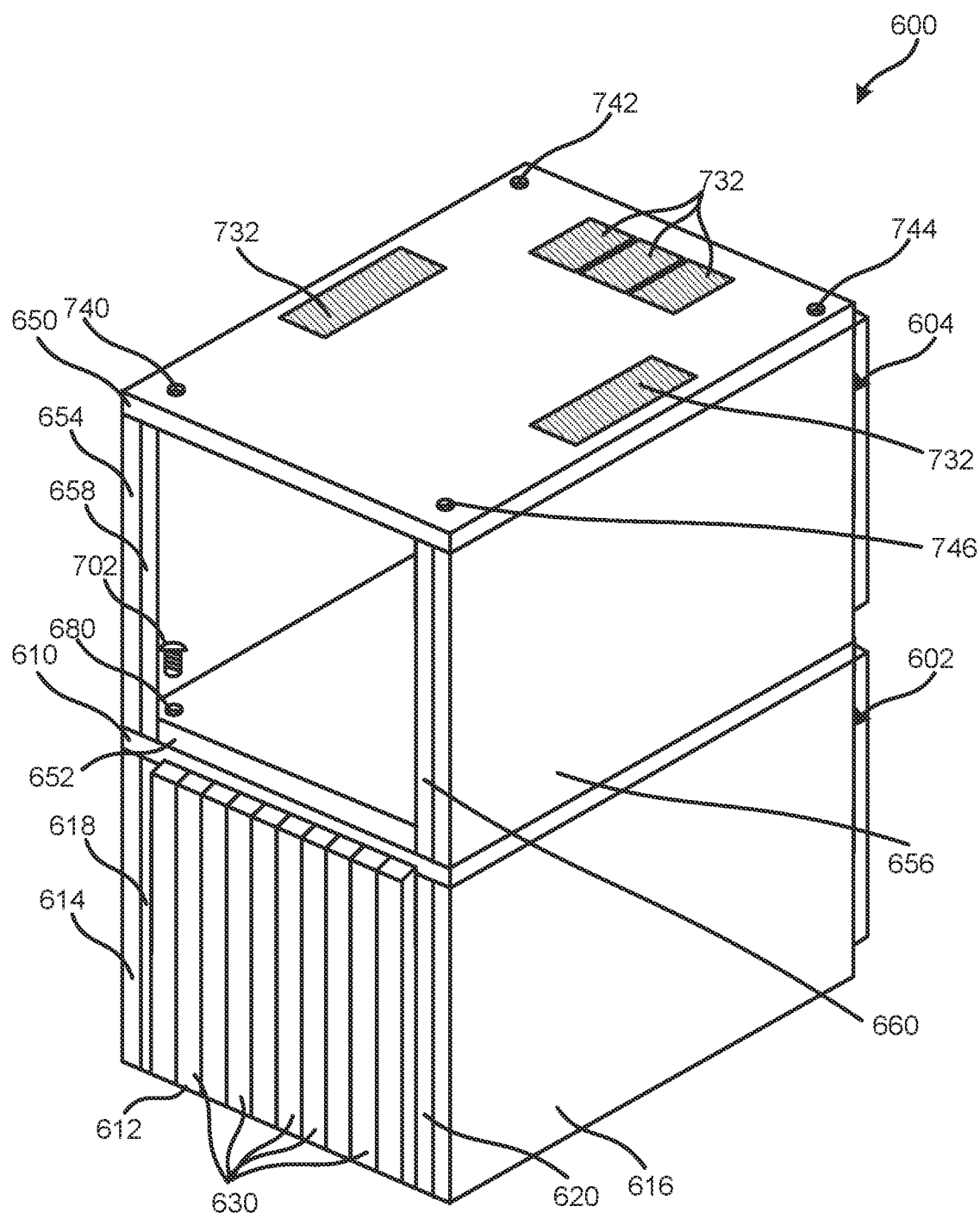
FIG. 7 is a perspective view of two flexible orientation rack cabinets being secured together according to at least one embodiment of the present disclosure.

FIGS. 6 and 7 illustrate a server rack system 600 including flexible orientation rack cabinets 602 and 604 according to at least one embodiment of the present disclosure. Flexible orientation rack cabinets 602 and 604 may be substantially similar to flexible orientation rack cabinet 100 of FIGS. 1-5. In an example, flexible orientation rack cabinet 602 may be configured in a vertical orientation as described above with respect to flexible orientation rack cabinet 100 in FIGS. 2 and 3. Flexible orientation rack cabinet 604 may be configured in a horizontal orientation as described above with respect to server rack cabinet 100 in FIGS. 4 and 5.

Flexible orientation rack cabinet 602 includes a top panel 610, a bottom panel 612, side panels 614 and 616, and flexible mounting flanges 618 and 620. Flexible orientation rack cabinet 602 may hold multiple vertical servers 630. Flexible orientation rack cabinet 602 also includes multiple air vents 632, and connecting holes 640, 642, 644, and 646. Flexible orientation rack cabinet 604 includes a top panel 650, a bottom panel 652, side panels 654 and 656, and flexible mounting flanges 658 and 660. Flexible orientation rack cabinet 604 may hold multiple horizontal servers 670. Flexible orientation rack cabinet 604 also includes connecting holes 680, 682, 684, and 686.

In an example, an individual may have a single server rack cabinet with multiple servers, such as flexible orientation rack cabinet 602 with vertical servers 630. If the individual wants to expand computing, storage, or the like capacity in system 600, the individual may purchase another server rack cabinet, such as flexible orientation rack cabinet 604. In certain examples, flexible orientation rack cabinets 602 and 604 may include solid mounting joint features such that the flexible orientation rack cabinets may be stacked up together to expand the U-space of system 600. In different examples, each new flexible orientation rack cabinet added to system 600 may be in the same or different orientation as other flexible orientation rack cabinets already in the system.

In certain examples, when flexible orientation rack cabinet 604 is to be stacked on flexible orientation rack cabinet 602, mounting holes of the flexible orientation rack cabinets may be aligned. For example, mounting hole 680 of flexible orientation rack cabinet 604 may be aligned with mounting hole 640 of flexible orientation rack cabinet 602 as illustrated by the arrow connecting the two mounting holes. Similarly, mounting hole 682 of flexible orientation rack cabinet 604 may be aligned with mounting hole 642 of flexible orientation rack cabinet 602 as illustrated by the arrow connecting the two mounting holes. Mounting hole 684 of flexible orientation rack cabinet 604 may be aligned with mounting hole 644 of flexible orientation rack cabinet 602 as illustrated by the arrow connecting the two mounting holes. Mounting hole 686 of flexible orientation rack cabinet 604 may be aligned with mounting hole 646 of flexible orientation rack cabinet 602 as illustrated by the arrow connecting the two mounting holes.

Referring now to FIG. 7, when flexible orientation rack cabinet 604 is placed on top of flexible orientation rack cabinet 602, mounting holes 680, 682, 684, and 686 of flexible orientation rack cabinet 604 may be directly above respective mounting holes 640, 642, 644, and 646 of flexible orientation rack cabinet 602. Bottom panel 652 of flexible orientation rack cabinet 604 may be in physical communication with top panel 610 of flexible orientation rack cabinet 602.

In an example, flexible orientation rack cabinet 602 and 604 may be securely connected to each other in any suitable manner. For example, a connecting component 702 may be inserted through mounting hole 680 of flexible orientation rack cabinet 604 and into mounting hole 640 of flexible orientation rack cabinet 602 of FIG. 6. In certain examples, connecting component 702 may be any suitable component to securely hold flexible orientation rack cabinet 604 in physical communication with flexible orientation rack cabinet 602. For example, connecting component 702 may be a screw, a bolt with a nut, or the like to securely hold the flexible orientation rack cabinets together. For brevity and clarity, only a single connecting component 702 has been described. One of ordinary skill in the art will recognize that substantially similar connecting components may be utilized to connect mounting hole 682 to mounting hole 642, mounting hole 684 to mounting hole 644, and mounting hole 686 to mounting hole 646.

In certain examples, flexible orientation rack cabinet 604 includes vents 732 and mounting holes 740, 742, 744, and 746 within top panel 650. In an example, vents 732 may provide air flow to the servers located within flexible orientation rack cabinet 604. Mounting holes 740, 742, 744, and 746 may be utilized to securely connect flexible orientation rack cabinet 604 with another flexible orientation rack cabinet. Based on another flexible orientation rack cabinet being stacked on and securely connected to flexible orientation rack cabinet 604, an amount of U-space within system 600 may increase beyond just flexible orientation rack cabinets 602 and 604.

Although only a few exemplary embodiments have been described in detail herein, those skilled in the art will readily appreciate that many modifications are possible in the exemplary embodiments without materially departing from the novel teachings and advantages of the embodiments of the present disclosure. Accordingly, all such modifications are intended to be included within the scope of the embodiments of the present disclosure as defined in the following claims. In the claims, means-plus-function clauses are intended to cover the structures described herein as performing the recited function and not only structural equivalents, but also equivalent structures.

The above-disclosed subject matter is to be considered illustrative, and not restrictive, and the appended claims are intended to cover any and all such modifications, enhancements, and other embodiments that fall within the scope of the present invention. Thus, to the maximum extent allowed by law, the scope of the present invention is to be determined by the broadest permissible interpretation of the following claims and their equivalents and shall not be restricted or limited by the foregoing detailed description.

What is claimed is:

1. A flexible orientation rack cabinet comprising:
    a top panel including a first U-space adjustment portion;
    a bottom panel including a second U-space adjustment portion;
    first and second edge panels;
    a first flexible mounting flange in physical communication with the first edge panel, the first flexible mounting flange including a third U-space adjustment portion; and
    a second flexible mounting flange in physical communication with the second edge panel, the second flexible mounting flange including a fourth U-space adjustment portion, wherein the flexible orientation rack cabinet is in a first orientation when a first plurality of server rails is attached to the first U-space adjustment portion and a second plurality of server rails is attached to the second U-space adjustment portion, wherein the flexible orientation rack cabinet is in a second orientation when a third plurality of server rails is attached to the third U-space adjustment portion and a fourth plurality of server rails is attached to the fourth U-space adjustment portion, wherein the plurality of first server rails and the plurality of second server rails are not connected at a same time.

2. The flexible orientation rack cabinet of claim 1, wherein the first orientation is a vertical orientation, and the second orientation is a horizontal orientation.

3. The flexible orientation rack cabinet of claim 1, further comprising: a plurality of mounting holes within the top panel, the mounting holes to connect the flexible orientation rack cabinet to another flexible orientation rack cabinet.

4. The flexible orientation rack cabinet of claim 1, wherein the flexible orientation rack cabinet has a first inner height dimension when the first and second U-space adjustment portions are within the flexible orientation rack cabinet, and the flexible orientation rack cabinet has a second inner height dimension when first server rails are attached to the first and second U-space adjustment portions.

5. The flexible orientation rack cabinet of claim 4, wherein the second inner height dimension is a 10U server space distance.

6. The flexible orientation rack cabinet of claim 1, further comprising: a plurality of vents within the top panel, the vents enable air flow within the flexible orientation rack cabinet.

7. The flexible orientation rack cabinet of claim 1, wherein each of the first, second, third and fourth U-space adjustment portions include a different plurality of hole holes and lines to enable attachment of the first server rails and the second server rails.

8. A flexible orientation rack comprising:
a top panel including a first plurality of vertical server rails along a length of the top panel when the flexible orientation rack cabinet is in a vertical orientation;
a bottom panel including a second plurality of vertical server rails along a length of the bottom panel when the flexible orientation rack cabinet is in the vertical orientation;
first and second edge panels in physical communication with the top and bottom panels;
a first flexible mounting flange in physical communication with the first edge panel, the first flexible mounting flange including a first U-space adjustment portion, the flexible orientation rack cabinet is in a horizontal orientation when a first plurality of horizontal server rails is connected to the first U-space adjustment portion; and
a second flexible mounting flange in physical communication with the second edge panel, the second flexible mounting flange including a second U-space adjustment portion, wherein the flexible orientation rack cabinet is in the horizontal orientation when on a second plurality of horizontal server rails are connected to the first U-space adjustment portion, wherein a combination of the first and second plurality of vertical server rails are not connected at a same time as the first and second plurality of horizontal server rails.

9. The flexible orientation rack cabinet of claim 8, further comprising: a plurality of mounting holes within the top panel, the mounting holes to connect the flexible orientation rack cabinet to another flexible orientation rack cabinet.

10. The flexible orientation rack cabinet of claim 8, wherein the flexible orientation rack cabinet has an inner width dimension between the first and second U-space adjustment portions, and the flexible orientation rack cabinet has an inner height dimension between the first and second plurality of vertical server rails.

11. The flexible orientation rack of claim 10, wherein the inner height dimension is a 10U server space distance.

12. The flexible orientation rack of claim 10, wherein the inner height dimension is less than the inner width dimension.

13. The flexible orientation rack cabinet of claim 8, further comprising: a plurality of vents within the top panel, the vents enable air flow within the flexible orientation rack cabinet.

14. The flexible orientation rack of claim 8, wherein the first and second flexible mounting flanges support a plurality of servers within the flexible orientation rack cabinet.

15. The flexible orientation rack of claim 14, wherein the servers are in a vertical orientation in between the first and second pluralities of vertical server rails.

16. An information handling system comprising:
a first flexible orientation rack cabinet including:
a first top panel including a first U-space adjustment portion;
a first bottom panel including a second U-space adjustment portion;
first and second edge panels in physical communication with the first top panel and the first bottom panel;
a first flexible mounting flange in physical communication with the first edge panel, the first flexible mounting flange including a third U-space adjustment portion; and
a second flexible mounting flange in physical communication with the second edge panel, the second flexible mounting flange including a fourth U-space adjustment portion, wherein the first flexible orientation rack cabinet is in a first orientation when a first plurality of server rails is attached to the first U-space adjustment portion and a second plurality of server rails is attached to the second U-space adjustment portion; and
a second flexible orientation rack cabinet including:
a second top panel including a fifth U-space adjustment portion;
a second bottom panel including a sixth U-space adjustment portion, wherein the second bottom panel is in physical communication with the first top panel of the first flexible orientation rack cabinet;
third and fourth edge panels in physical communication with the second top panel and the second bottom panel;
a third flexible mounting flange in physical communication with the third edge panel, the third flexible mounting flange includes a seventh U-space adjustment portion; and
a fourth flexible mounting flange in physical communication with the fourth edge panel, the fourth flexible mounting flange including an eighth U-space adjustment portion, wherein the second flexible orientation rack cabinet is in a second orientation when a third plurality of server rails is attached to the seventh U-space adjustment portion and a fourth plurality of server rails is attached to the eighth U-space adjustment portion, wherein the second flexible orientation rack cabinet is in the first orientation when a fifth plurality of server rails is attached to the fifth U-space adjustment portion and a sixth plurality of server rails is attached to the sixth U-space adjustment portion, wherein the plurality of second server rails and the plurality of third server rails are not connected at a same time.

17. The information handling system of claim 16, wherein the first flexible orientation rack cabinet further includes: a plurality of first mounting holes within the first top panel; and wherein the second flexible orientation rack cabinet further includes: a plurality of second mounting holes within the second bottom panel.

18. The information handling system of claim 16, further comprising: a connecting component inserted through one of the first mounting holes and one of the second mounting holes, wherein the connecting component securely connects the first and second flexible orientation rack cabinets.

19. The information handling system of claim 16, wherein the first orientation is a vertical orientation, and the second orientation is a horizontal orientation.

* * * * *